(12) United States Patent
Choe

(10) Patent No.: US 7,901,999 B1
(45) Date of Patent: Mar. 8, 2011

(54) FPGA EQUIVALENT INPUT AND OUTPUT GRID MUXING ON STRUCTURAL ASIC MEMORY

(75) Inventor: Kok Heng Choe, Penang (MY)

(73) Assignee: Altera Corporation, San Jose, CA (US)

( * ) Notice: Subject to any disclaimer, the term of this patent is extended or adjusted under 35 U.S.C. 154(b) by 127 days.

(21) Appl. No.: 12/429,902

(22) Filed: Apr. 24, 2009

Related U.S. Application Data

(62) Division of application No. 11/405,807, filed on Apr. 17, 2006, now Pat. No. 7,542,324.

(51) Int. Cl.
*H01L 21/82* (2006.01)
*H01L 21/4763* (2006.01)

(52) U.S. Cl. ......... 438/129; 438/128; 438/622; 438/637; 257/E21.602; 257/E21.613

(58) Field of Classification Search ........... 257/E21.602, 257/E21.613
See application file for complete search history.

(56) References Cited

U.S. PATENT DOCUMENTS

| | | | |
|---|---|---|---|
| 5,867,422 A | 2/1999 | John | |
| 5,870,350 A | 2/1999 | Bertin et al. | |
| 6,242,767 B1 | 6/2001 | How et al. | |
| 6,504,401 B1 * | 1/2003 | Huang et al. | 326/81 |
| RE38,651 E | 11/2004 | Sung et al. | |
| 7,363,422 B2 | 4/2008 | Perego et al. | |
| 7,542,324 B1 | 6/2009 | Choe | |
| 2006/0084240 A1* | 4/2006 | Poo et al. | 438/460 |
| 2006/0267990 A1* | 11/2006 | Rogers et al. | 345/502 |
| 2007/0033337 A1* | 2/2007 | Butt et al. | 711/105 |

* cited by examiner

*Primary Examiner* — Savitri Mulpuri
*Assistant Examiner* — Mohsen Ahmadi
(74) *Attorney, Agent, or Firm* — Ropes & Gray LLP

(57) ABSTRACT

The present invention provide circuits, methods, and apparatus directed to an integrated circuit having a memory interface that is configurable to have one of a multiple different bus widths. The memory interface has a first set of lines and a second set of lines. The first and second set of lines are arranged such that there are multiple locations at which a via may be placed to connect a line of the first set to a line of the second set. The placement of the vias determines the bus width of the memory interface.

10 Claims, 12 Drawing Sheets

FPGA EQUIVALENT INPUT AND OUTPUT GRID MUXING ON STRUCTURAL ASIC MEMORY

CROSS REFERENCE TO RELATED APPLICATIONS

The present application is a divisional of U.S. patent application Ser. No. 11/405,807, filed Apr. 17, 2006, and entitled "FPGA Equivalent Input and Output Grid Muxing on Structural ASIC Memory", and is herein fully incorporated by reference for all purposes.

BACKGROUND

This invention relates to switching or multiplexing structures for sending and retrieving variable amounts of data from memory or other circuit elements within integrated circuit devices. Devices of the type that are sometimes known as structured application-specific integrated circuits ("structured ASICs") may particularly benefit.

A possible use of structured ASIC technology is to produce ASICs that are functionally equivalent to programmed field-programmable gate arrays ("FPGAs"). After a logic design has been adequately "proven" in an FPGA, the design may be "migrated" to a structured ASIC. Structured ASICs offer several key performance advantages over FPGAs, primarily in the areas of power reduction, clock performance, manufacturing costs, and core density. A potential competing concern that might reduce such benefits of the migration from an FPGA to an ASIC is maintaining equivalent functionality between the ASIC and the FPGA.

For instance, in many FPGA devices, it is desirable for the memory to be designed to support multiple bus width configurations. To support the multiple bus width configurations, the FPGA requires large multiplexing, or muxing, structures to handle the proper selection of data to be read from or written to memory. However, directly transferring the multiple bus width configurations from the FPGA to the corresponding ASIC would degrade performance by leading to a bigger layout area, a more complex design, and an increased loading on the input and output muxing paths.

Accordingly, when the FPGA has the flexibility of multiple bus width configurations, it is not desirable to directly transfer the multiple data bus width configurations from the FPGA to the corresponding ASIC. Such direct transferring would at least partially defeat the purpose of having an ASIC, which is designed to be smaller and faster than the FPGA.

It is therefore desirable to have a muxing structure within an ASIC that does not degrade performance and that can provide equivalent functionality to an FPGA having multiple bus width configurations.

SUMMARY

Accordingly, embodiments of the present invention provide circuits, methods, and apparatus directed to an integrated circuit having a memory interface that is configurable to have one of a multiple different bus widths. The memory interface is compact and transmits signals efficiently. In one embodiment, the memory interface has a first set of lines and a second set of lines. The first set of lines may be organized to have a first orientation and the second set of lines to have a second orientation. The first and second set of lines are arranged such that there are multiple locations at which a via may be placed to connect a line of the first set to a line of the second set. The placement of the vias determines the bus width of the memory interface. In one embodiment, there are a greater number of locations than vias that are placed.

One embodiment of the present invention has a number of switches, which may equal the maximum bus width available. Each switch may be coupled with a memory module, which may be done though a sensing amplifier and write driver. Each switch may also be coupled with a line of the first set of lines. In another embodiment, the placement of the vias couples together a group of lines of the first set. The number of lines in the group may be $2^N$, where N is an integer. In some embodiments, the state of a switch may depend on control signals. The control signals may be formulated from values in an address register. In other embodiments, one or more first set of data lines are also coupled with a circuit element, which may be a data register.

DESCRIPTION OF EXEMPLARY EMBODIMENTS

Embodiments of the present invention are directed to methods and multiplexing (muxing) structures used, for example, to send data to or retrieve data from a memory module or other circuit element along data buses of different widths. Generally, the data is produced by a structured application-specific integrated circuit (ASIC). However, one skilled in the art will appreciate that embodiments of the invention may be applied to other types of integrated circuits and that the transmission of data along the data bus need not involve a memory module.

Figure 1:
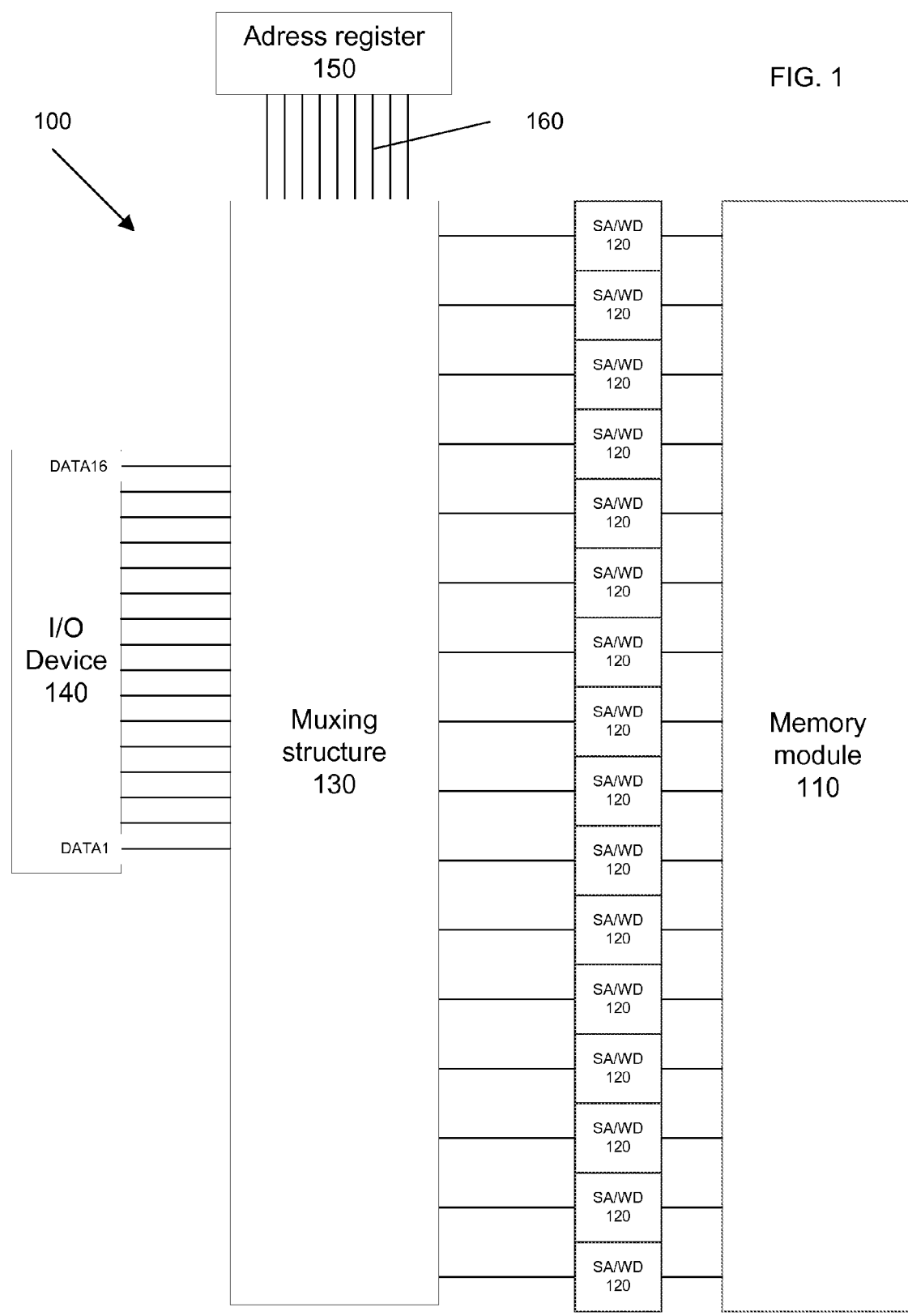
FIG. 1 illustrates an I/O device including a muxing structure for sending or retrieving data.

FIG. 1 shows an I/O device 100 with a memory module 110 capable of transferring data up to sixteen bits (X16) at a time. Each bit is transmitted through one of sixteen sense amplifier/write drivers (SA/WD) 120. During an operation of reading data from the memory module 110, each SA/WD may load in a different bit of data from the memory module 110. The data bits are then transmitted to a muxing structure (or memory interface) 130 for selecting which data bits are sent to which input ports of an I/O element 140 of the integrated circuit. In a similar fashion, for a write operation, data is received in the muxing structure 130 from the I/O element 140. The muxing structure 130 then selects which data is sent to which SA/WDs.

For some circuits or parts of circuits, it may be desirable to have the I/O element 140 send or receive fewer than the maximum number bits (16 in this example) during one time cycle.

This reduction in bus width may be done to save resources, such as routing. For a one-bit read operation, the muxing structure 130 must choose which of the 16 bits in the SA/WDs 120 is sent to which port of the I/O element 140. For a one-bit write operation, the muxing structure 130 must choose to which of the SA/WDs 120 to send the data bit from a port of the I/O element 140. In the case where only one bit is sent at a time, the I/O element 140 may be scaled down to be only one bit in size. Thus, only the DATA1 port would be accessible. Similarly, in the case where two bits are read, the selection circuit must choose which two bits in the SA/WDs are sent to the proper two ports of the I/O element 140.

The selection of the proper data bits is controlled by address data in the address register 150. The address data is sent to the muxing structure 130 through address lines 160. The address data corresponds to which data is requested.

Prototyping of the integrated circuit typically occurs when the integrated circuit is created from a programmed field-programmable gate array ("FPGA"). During prototyping, it may not be easy to know the number of data bits that are desired to be sent per time cycle. Thus, at this prototyping stage, it may be desirable for muxing structure 130 to be able to send different amounts of data between the memory module 110 and the I/O element 140. Such configurations are termed multiple bus width configurations.

Figure 2:
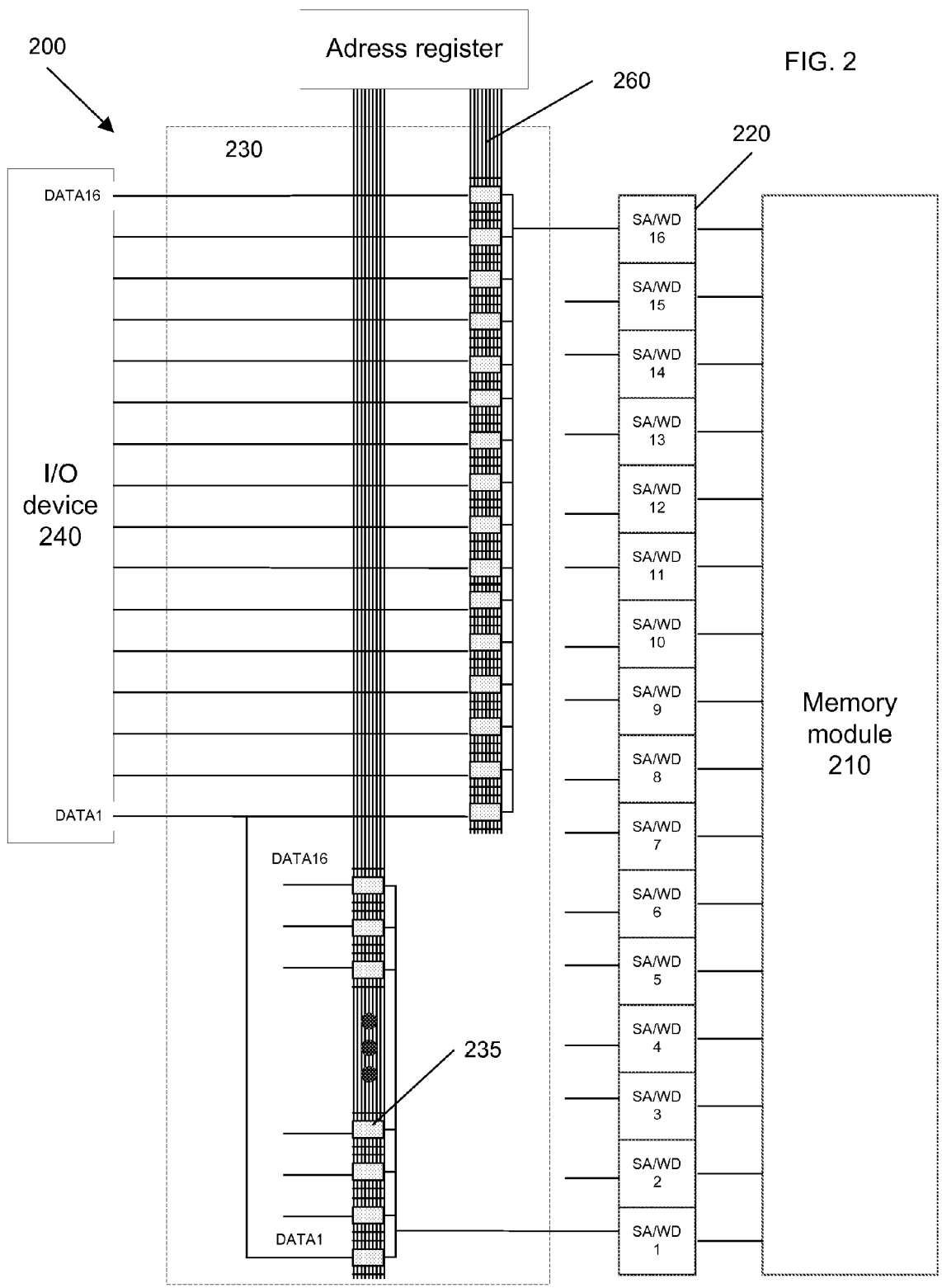
FIG. 2 illustrates an I/O device including a schematic of a muxing structure with a configurable bus width.

FIG. 2 shows one I/O device 200 capable of multiple bus width configurations. The muxing structure 230 is made of sixteen switches 235 for each SA/WD 220. For convenience, only the switches corresponding to the top and bottom SA/WD are shown, and not all of the switches for the bottom SA/WD are depicted. In FIG. 2, the muxing structure 230 is denoted with dashed lines.

The switches 235 may be a pass gate, a multiplexer, or other such selection device. Each switch 235 controls whether the data bit, from the SA/WD to which the switch is connected, is sent to the port of the I/O element 240 to which it is connected. Whether the data bit is sent depends on the data signals on the address lines 260. This configuration could handle any data bus width of X1-X16.

As an example, for an X8 bus width, the address lines 260 may select the switches 235 such that the data bits in the SA/WDs labeled 9-16 are sent to the respective DATA1-DATA8 ports of the I/O element 240. Alternatively, for an X4 bus width, the address lines 260 may select the switches 235 such that the data bits in any four SA/WDs are coupled respectively to the DATA1, DATA6, DATA9, and DATA 14 ports of the I/O element 240. Any such configuration is possible since every SA/WD 220 is connected to DATA port.

However, this is not very efficient as there are 256 switches. Muxing structure 230 takes up a lot of space, and the number of address lines 260 is large.

Figure 3:
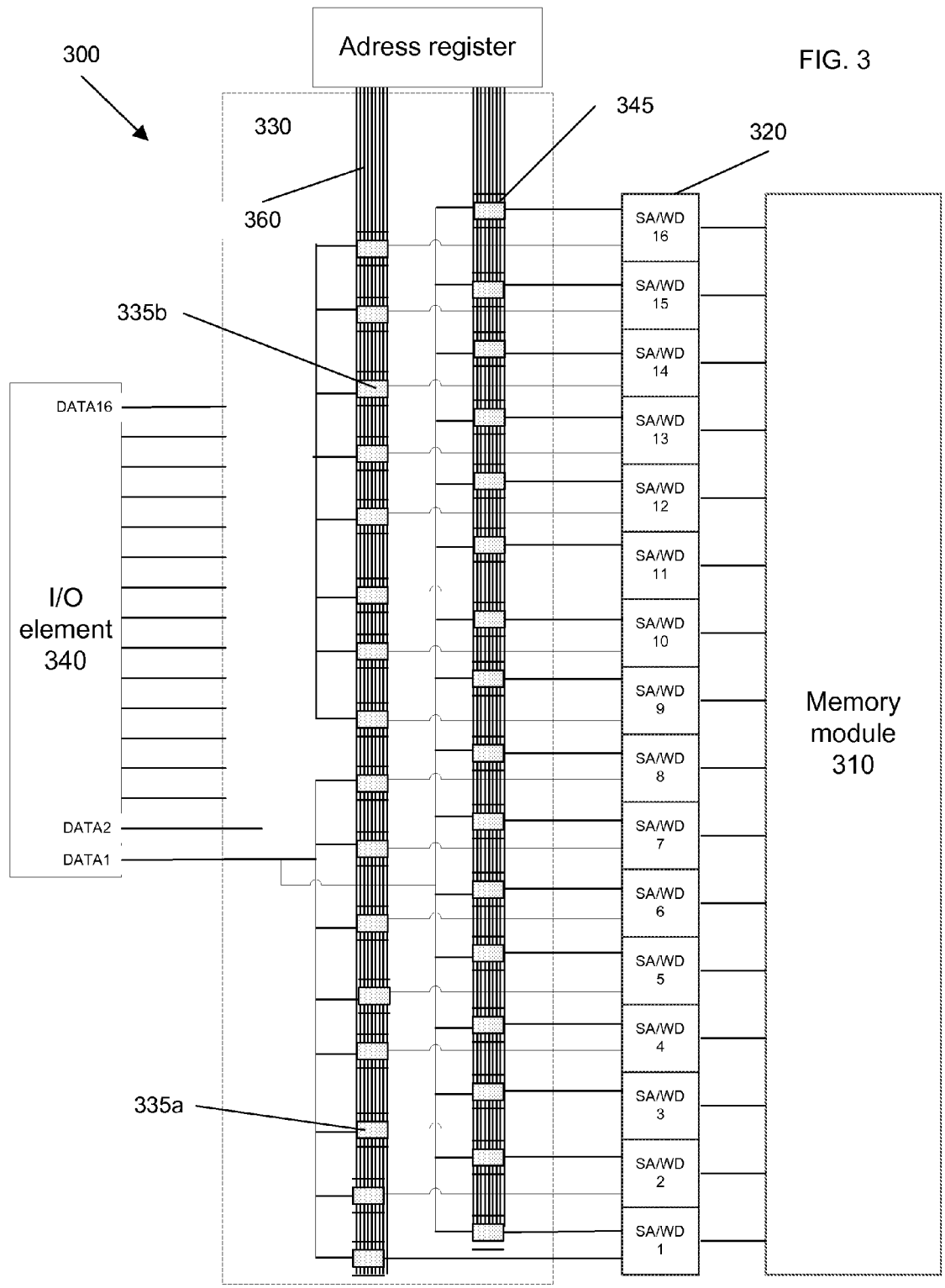
FIG. 3 illustrates an I/O device including a schematic of a muxing structure where only certain bus widths are supported.

To further illustrate other multiple bus width configurations, FIG. 3 illustrates an I/O device 300 with fewer switches. FIG. 3 shows a configuration for the muxing structure 330 such that only the bus widths of X1 and X2 are supported. For convenience, only bus widths of X1 and X2 are shown. Typically, five bus widths of X1, X2, X4, X8, and X16 would be supported. By providing for only five different bus widths, the number of switches is decreased to 80 and the number of address lines is also decreased since only five sets of vertical address lines 360 are required.

In FIG. 3, the switches 335 and 345 are grouped such that all of the switches associated with the same bus width lie in the same vertical column. Although switches associated with the same bus width lie on the same set of address lines 360, this is not required. The column of switches 345 on the right are associated with the X1 bus width. Each switch 345 is coupled to the DATA1 port of the I/O element 340. The column of switches 335a and 335b on the left are associated with the X2 bus width. The Bottom eight switches 335a are coupled to the DATA1 port of the I/O element 340, and the top eight switches 335b are coupled to the DATA2 port. For the X2 bus width, the data bound for DATA2 must be in a prescribed set of SA/WDs, but in practicality no flexibility is lost.

Similar organization of the switches may be made for other bus widths. For the X4 bus width, SA/WDs labeled 1-4 may be associated with switches coupled to DATA1; SA/WDs 5-8 may be associated with switches coupled to DATA2; SA/WDs 9-12 may be associated with switches coupled to DATA3; and SA/WDs 13-16 may be associated with switches coupled to DATA4. In this manner, there are 16 switches per bus width, which gives the total number of switches as 80.

Figure 4:
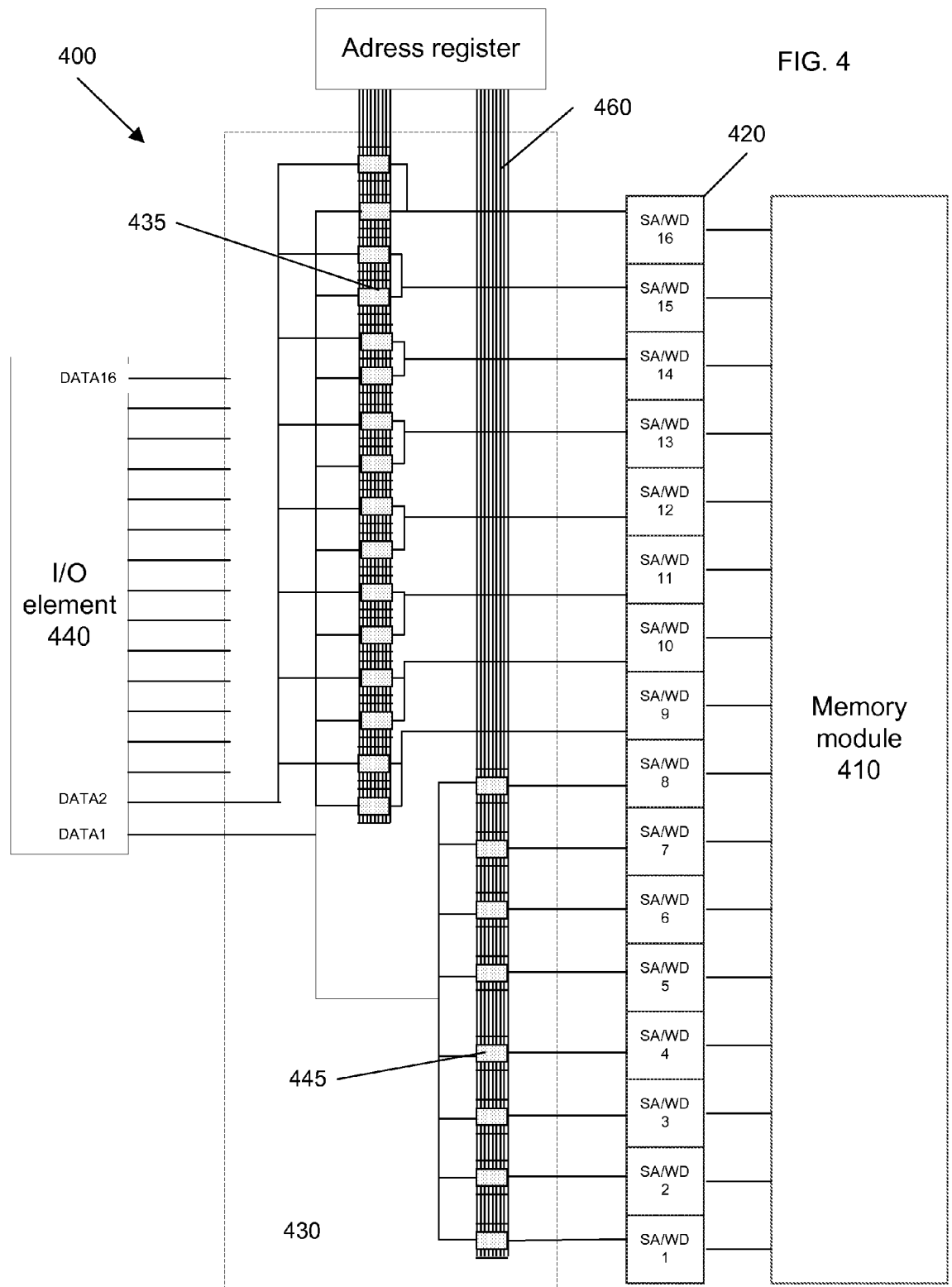
FIG. 4 illustrates an I/O device including a schematic of an optimized and shared muxing structure for bus widths X1 and X2.

Illustrating another multiple bus width configuration, FIG. 4 shows an I/O device 400 that supports bus widths X1 and X2. In muxing structure 430, the left vertical line of switches 435 along a set of address lines 460 may be shared among the two bus widths. In FIG. 4, the eight SA/WDs 420 labeled 9-16 are coupled to groups of two switches each. One of each of these two switches is coupled to the DATA1 port of I/O element 440. This coupling allows these switches and the associated SA/WDs to support an X1 bus width. The rest of the support for the X1 bus width comes from the bottom right eight switches 445.

The other of the groups of switches 435 is coupled to the DATA2 port of I/O element 440. This coupling allows these switches and the associated SA/WD to support an X2 bus width. The rest of the support for the X2 bus width comes from the bottom right eight switches 445. The configuration of the muxing structure 430 reuses the switches 445 for the X1 bus width for larger bus widths. In this manner, eight switches have been effectively removed while maintaining the same flexibility of having multiple bus width configurations.

Figure 5:
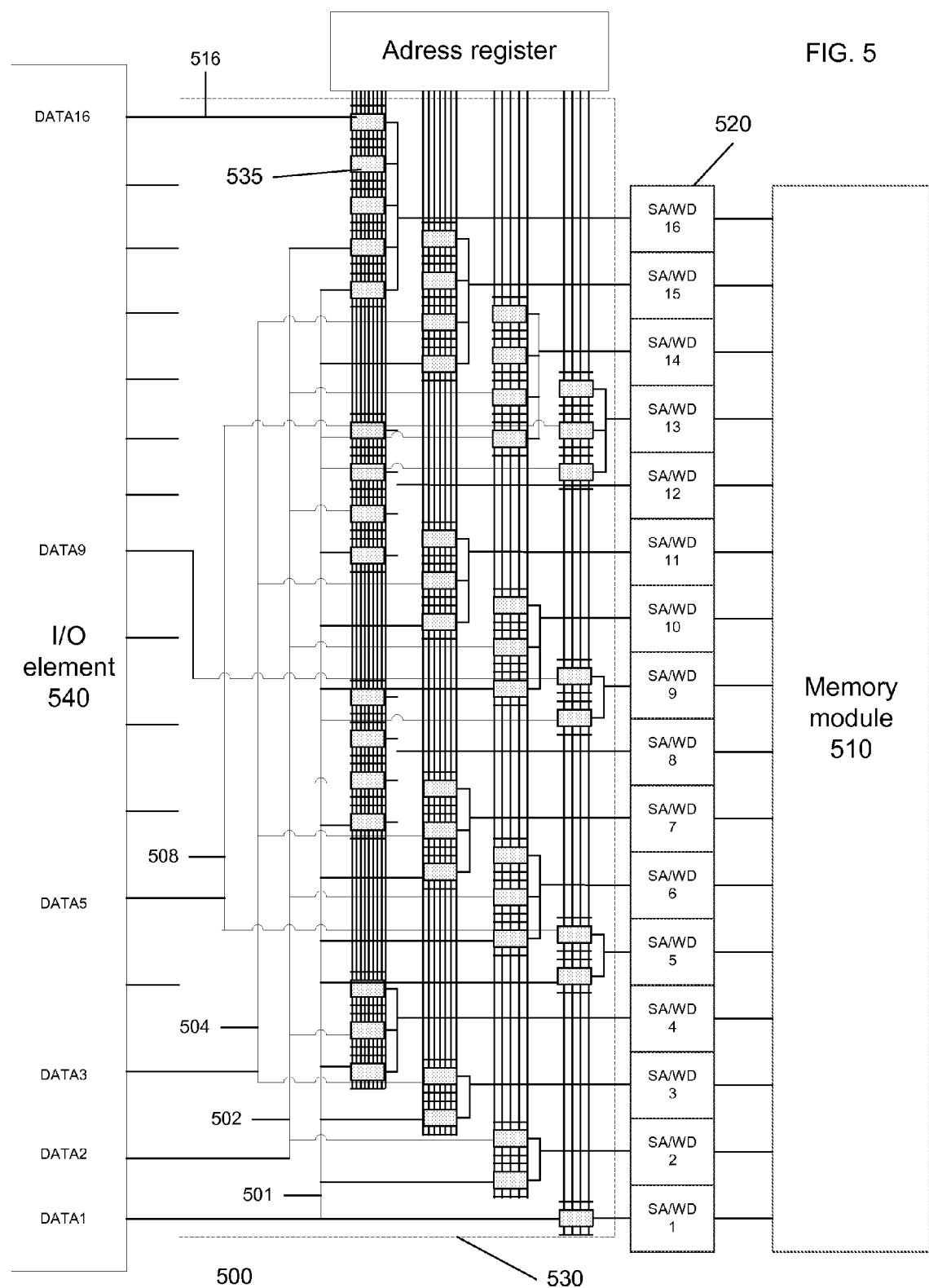
FIG. 5 illustrates an I/O device including a schematic of an optimized and shared muxing structure for bus widths X1, X2, X4, X8, and X16 that is improved by incorporating an embodiment of the present invention.

FIG. 5 shows an I/O device 500 adopting the basic shared muxing structure in FIG. 4 while supporting five widths of X1, X2, X4, X8, and X16. The muxing structure 530 takes advantage of the fact that not every SA/WD 520 needs to have data going to every DATA port of the I/O element 540.

To support the X1 bus width, every SA/WD 520 is coupled to a switch 535 that is coupled to the DATA1 port of the I/O element 540. Line 501 couples 16 switches to the DATA1 port. To support the X2 bus width, the eight SA/WDs 520 labeled with even numbers are coupled to a switch that is coupled to the DATA2 port of the I/O element 540. Line 502 couples these 8 switches to the DATA2 port. The other eight SA/WDs labeled with odd numbers continue to be connected to the DATA1 port during operation with the X2 data bus width. Since all of the SA/WDs 520 are coupled to the DATA1 port, it is possible for the odd SA/WDs to still transmit data to and from the DATA 1 port.

To support the X4 bus width, four SA/WDs labeled 3, 7, 11, and 15 are coupled to a switch that is coupled to the DATA3 port of the I/O element 540. Line 504 couples these 4 switches to the DATA3 port. The DATA4 port may be coupled to four SA/WDs labeled 4, 8, 12, and 16. For convenience, these connections are not shown. In one configuration, the SA/WDs labeled 2, 6, 10, and 14 remain coupled to the DATA2 port and may be used to transfer data to this port in an X4 bus width configuration. The SA/WDs labeled 1, 5, 9, and 13 remain coupled to the DATA1 port and may be used to transfer data to this port in an X4 bus width configuration.

To support the X8 bus width, two SA/WDs 520 labeled 5 and 13 are coupled to a switch that is coupled to the DATA5 port of the I/O element 540. Line 508 couples these 2 switches to the DATA5 port. To support the X16 bus width, the DATA9-DATA16 ports of the I/O element 540 are coupled to a single switch that is respectively coupled to SA/WDs labeled 9-16. For example, line 516 couples the DATA 16 port to a switch that is coupled to SA/WD 16.

The total number of switches used by I/O device 500 is reduced to 48 switches. However, the number of routing and address connections is still large, and the number of switches is not insignificant. This is true particularly when the circuit is taken from an FPGA to a structured ASIC. The benefits of greater speed and smaller size provided by an ASIC design would be compromised with the muxing structure in I/O device 500.

Embodiments of the present invention take advantage of the fact that the design of the FPGA is already established when it is migrated to an ASIC. Thus, when the FPGA is transferred to the ASIC, the width of each data bus associated with each memory module is known. This knowledge of the data bus widths allows smaller and more efficient muxing structures to be employed within the ASIC. Additionally, since each memory module may have a different bus width associated with it, each bus width of the ASIC needs to be easily configured to a fixed size taken from the possible bus widths.

Figure 6:
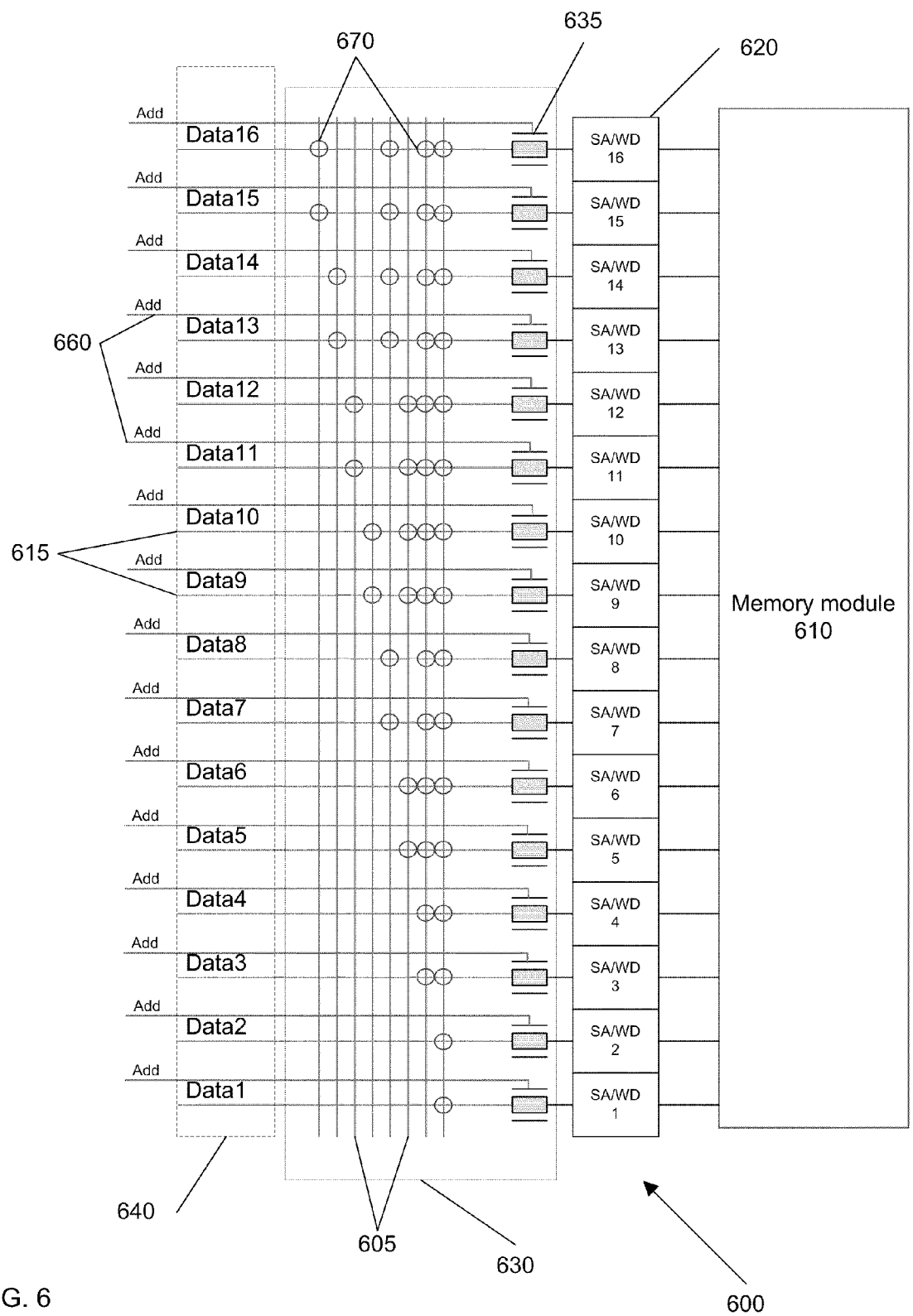
FIG. 6 shows an I/O device including a muxing structure configurable to have one of multiple bus widths according to an embodiment of the present invention.

To this end, FIG. 6 shows I/O device 600 according to an embodiment of the invention. The I/O device 600 may be part of a larger integrated circuit and is capable of being configured to have any fixed bus width between X1-X16. In some embodiments, the bus width is a power of two, i.e. $2^N$, but any value is possible.

In FIG. 6, the memory module 610 is connected to sixteen SA/WDs 620. The memory module may be many memory cells formed in an array, and may be CRAM, ERAM, MRAM, DRAM, SDRAM, registers, FIFO buffers, or any other suitable type of memory or circuit element capable of storing a data bit. The SA/WDs 620 may be any device that strobes the memory module 610 during a clock cycle to read or write one or more bits of data. The SA/WDs 620 also may be incorporated into the memory module 610.

Muxing structure 630 transfers data bits between the SA/WDs 620 and I/O element 640 and is shown with a dotted line. Within muxing structure 630, there are 16 switches 635, each connected though a data signal line to one SA/WD 620. The switches 635 may be a pass gate, a multiplexer, or other such selection device. In one embodiment, the muxing structure 630 could include the SA/WDs 620.

A control signal along an address line 660 is connected to each switch 635 which controls whether the switch is open or not. As will be explained below, the address lines 660 may be connected to each other depending on the configuration. In some embodiments, the control signals along the address lines 660 are coupled to an address register. In other embodiments, the control signals may be attached to functional logic, clock circuitry, or external devices. Also, the muxing structure 630 may or may not include the address lines 660.

The vertical connector lines 605 and the horizontal I/O data signal lines 615 reside on different layers of the ASIC. In some embodiments, all of the lines 605 reside in one layer, and all of the lines 615 reside in another layer. In other embodiments, lines 605 may reside in different layers, and the lines 605 may reside in different layers. The use of horizontal and vertical lines is purely illustrative as each line may have any orientation. The I/O lines 615 connect an SA/WD to the I/O element 640. The I/O lines 615 may be connected to any of the DATA ports of an I/O element 640. For example in FIG. 6, the DATA1 port is coupled to SA/WD labeled 1; the DATA2 port is coupled to SA/WD labeled 2; and the other ports are similarly coupled. However, the order could be reversed, or the order could be random. The I/O element 640 may transmit the data to other parts of the integrated circuit. The I/O element may be a register, a buffer, functional logic, or one or more other circuit elements.

The circles 670 correspond to possible places where a via, electrical connection, may be made from a connector line 605 to an I/O line 615. Thus, each I/O line 615 may be electrically connected to each connector line 605. In practice, each I/O line 615 will only be electrically connected to one vertical line 605. The vias are placed to couple certain SA/WDs 620 together. Aspects of the invention will be more clear with the following figures showing embodiments configured for X1, X2, X4, X8, and X16 bus widths.

This embodiment allows for an automatic configuration of the bus width due to the preset steps of placing the vias for configuring the bus width. Although the configuration may be done manually, the automation of this procedure makes for an efficient chip design and manufacture.

Figure 7:
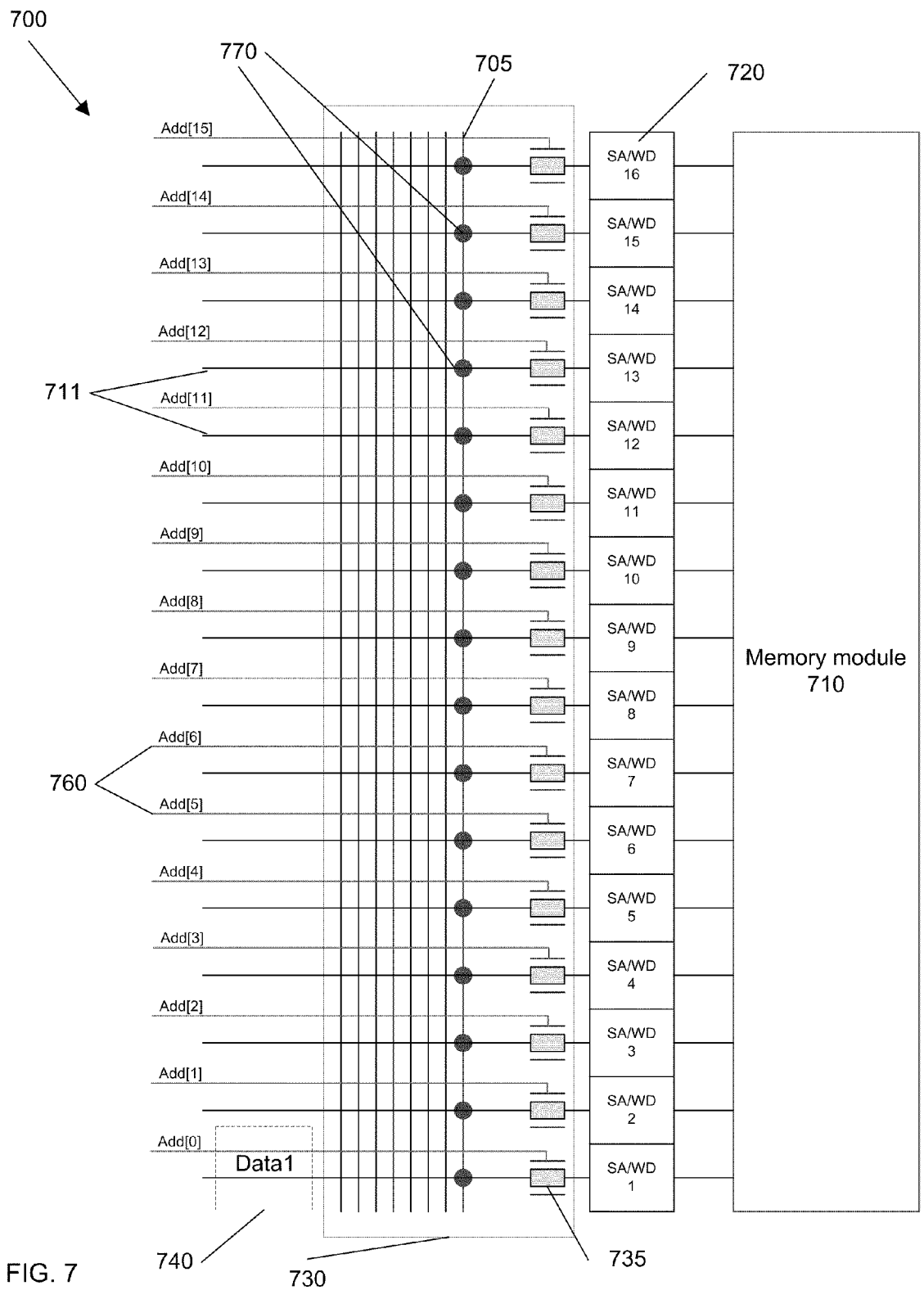
FIG. 7 shows an I/O device including a muxing structure configured to have a bus width of X1 according to an embodiment of the present invention.

FIG. 7 shows an example of an I/O device 700 configured for an X1 (one-bit) data bus width according to an embodiment of the invention. Muxing structure 730 is shown with a dotted line. During a read operation in this embodiment, one bit of data is sent from the memory module 710 to each of the SA/WDs 720. Correspondingly, during a write operation for this embodiment, one bit of data is sent from only one SA/WDs 720 to the memory module 710. Read and write operations could be based on one edge of a clock signal, both edges, a strobe signal, or other type of suitable signal. The SA/WDs 720 may be part of the memory module, part of a muxing structure, or separate devices.

Each SA/WD 720 is connected to one of the switches 735. Whether each switch 735 is in an open or closed state is controlled by one of the address lines 760. For this X1 embodiment, only one switch is open during any one I/O operation. Each switch is also connected to one of the I/O data signal lines 711. Each I/O line 711 is electrically connected to the same vertical connector line 705, e.g. by a via 770. Thus, each switch 735 and each SA/WD 720 is coupled to the DATA1 port of I/O element 740.

Accordingly, in this embodiment, the data bit only travels to and from the DATA1 port of the I/O element 740. As mentioned above, the address signals 760 control which data bit travels to or from the 16 SA/WDs 720. For example, during a read operation, if the 8th SA/WD was chosen, then the corresponding switch would be opened as controlled by the address signals 760. The data bit would travel from the switch along the corresponding line 711 to the electrical connection between I/O line 711 and the connector line 705. The data signal will travel then along the connector line 705 and will reach the lowermost I/O line which is electrically connected to the DATA1 port of the I/O element 740.

In this embodiment, regardless of which data bit from one of the SA/WDs is chosen, the data will be sent out to DATA1 since each one of the horizontal lines 711 that is connected to one of the switches 735 is connected the DATA1 port.

Figure 8:
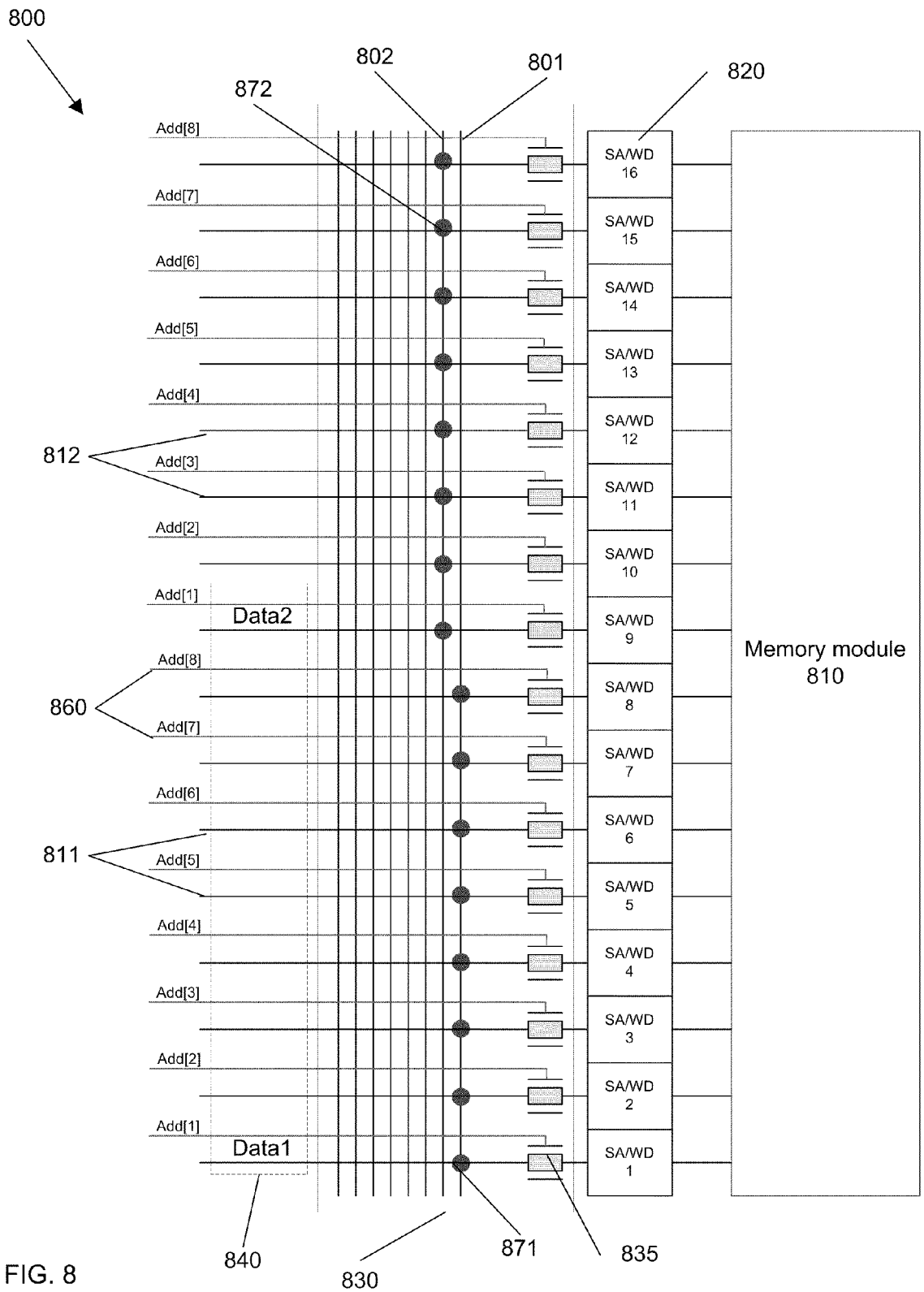
FIG. 8 shows an I/O device including a muxing structure configured to have a bus width of X2 according to an embodiment of the present invention.

FIG. 8 shows an example of an I/O device 800 configured for an X2 (two-bit) data bus width according to an embodiment of the invention. The construction of I/O device 800 is similar to that of I/O device 700. Muxing structure 830 is shown with a dotted line. There are sixteen SA/WDs 820 connected to the memory module 810. There are sixteen switches 835, each of which is connected to one SA/WD, and there are I/O lines 811 and 812 connected to the other end of each switch. In some embodiments, all of the I/O lines 811 and 812 may be connected to the I/O element 840, and in other embodiments only some of the I/O lines are connected to I/O element 840 while the rest may be terminated.

However in I/O device 800, all of the SA/WDs 820 are not coupled to the DATA1 port of the I/O element 840. The I/O lines 812 from the SA/WDs labeled 9-16 are each electrically connected through vias 872 to vertical connector line 802. Thus, SA/WDs labeled 9-16 are coupled to the DATA2 port of the I/O element 840. Which I/O line 812 is connected to the DATA1 port may vary. The I/O lines 811 from the SA/WDs labeled 1-8 are each electrically connected through vias 871 to vertical connector line 801. Thus, SA/WDs labeled 1-8 are coupled to the DATA1 port of the I/O element 840. Which eight SA/WDs are coupled to which DATA ports may vary according to any pattern. For example, the odd SA/WDs may be coupled to the DATA1 port and the even SA/WDs may be coupled to the DATA2 port.

The address lines 860 control which of the switches 835 are opened to transmit or receive a data bit. The eight address lines for DATA1 and the eight address lines for DATA2 may have the same values, or equivalently be electrically connected. For example, if add[1] is selected then the bits from SA/WDs labeled 1 and 9 are respectively coupled to the DATA1 and DATA2 ports. Alternatively, the eight address lines for DATA1 and the eight address lines for DATA2 may be uncorrelated. For example, add[5] may be selected for the DATA2 port, which would couple SA/WD labeled 13, and add[2] may be selected for the DATA1 port, which would couple SA/WD labeled 2.

Figure 9:
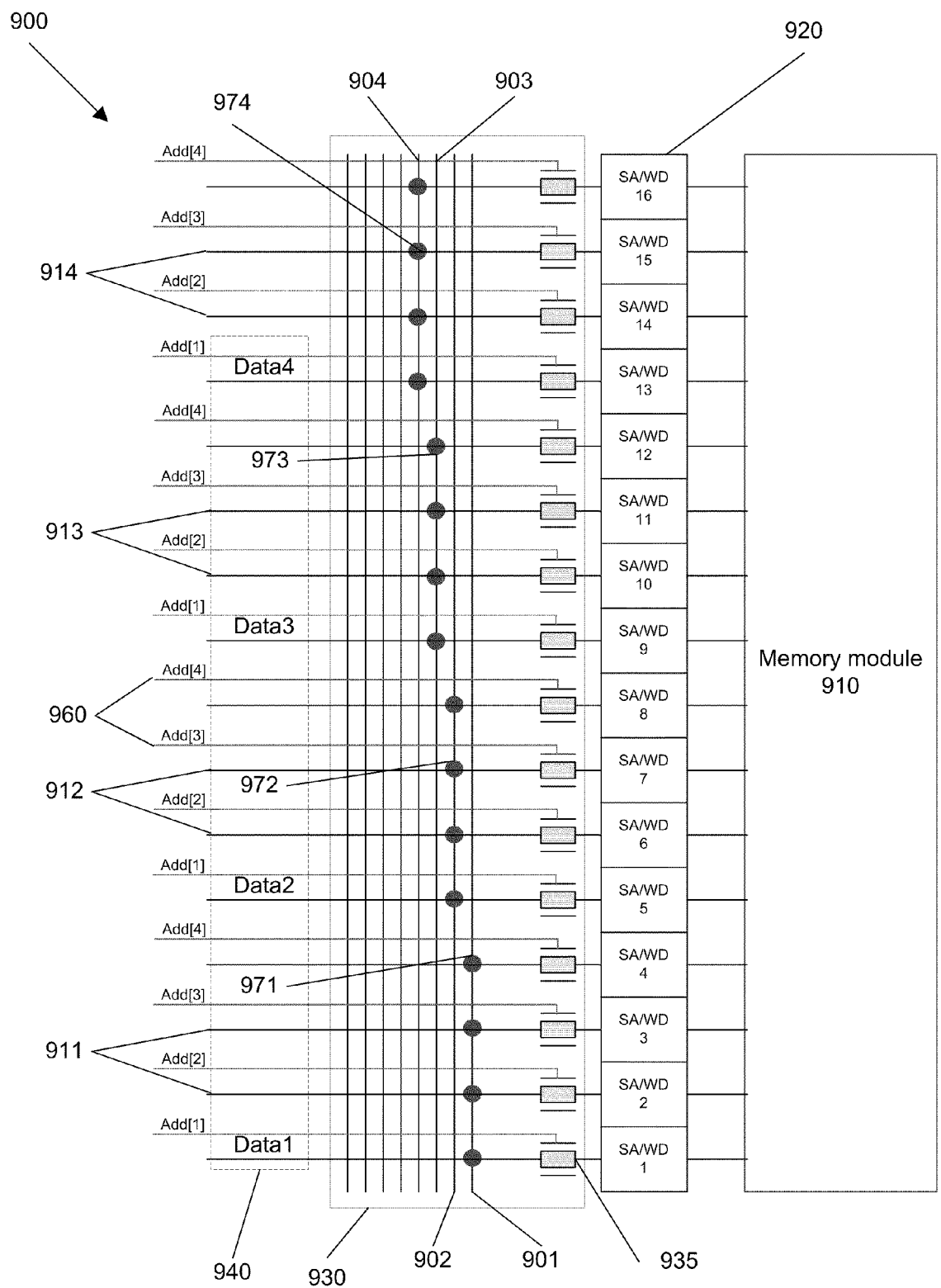
FIG. 9 shows an I/O device including a muxing structure configured to have a bus width of X4 according to an embodiment of the present invention.

FIG. 9 shows an example of an I/O device 900 configured for an X4 (four-bit) data bus width according to an embodiment of the invention. The construction of I/O device 900 is similar to that of I/O device 700. Muxing structure 930 is shown with a dotted line. There are sixteen SA/WDs 920 connected to the memory module 910. There are sixteen switches 935, each of which is connected to one SA/WD, and there are I/O lines 911, 912, 913, and 914 connected to the other end of each switch.

The I/O lines 914 from the SA/WDs labeled 13-16 are each electrically connected through vias 974 to vertical connector line 904. Thus, SA/WDs labeled 13-16 are coupled to the DATA4 port of the I/O element 940. The I/O lines 913 from the SA/WDs labeled 9-12 are each electrically connected through vias 973 to vertical connector line 903. Thus, SA/WDs labeled 9-12 are coupled to the DATA3 port of the I/O element 940.

The I/O lines 912 from the SA/WDs labeled 5-8 are each electrically connected through vias 972 to vertical connector line 902. Thus, SA/WDs labeled 5-8 are coupled to the DATA2 port of the I/O element 940. The I/O lines 911 from the SA/WDs labeled 1-4 are each electrically connected through vias 971 to vertical connector line 901. Thus, SA/WDs labeled 1-4 are coupled to the DATA1 port of the I/O element 940. The address lines 960 control which of the switches 935 are opened to transmit or receive a data bit.

Figure 10:
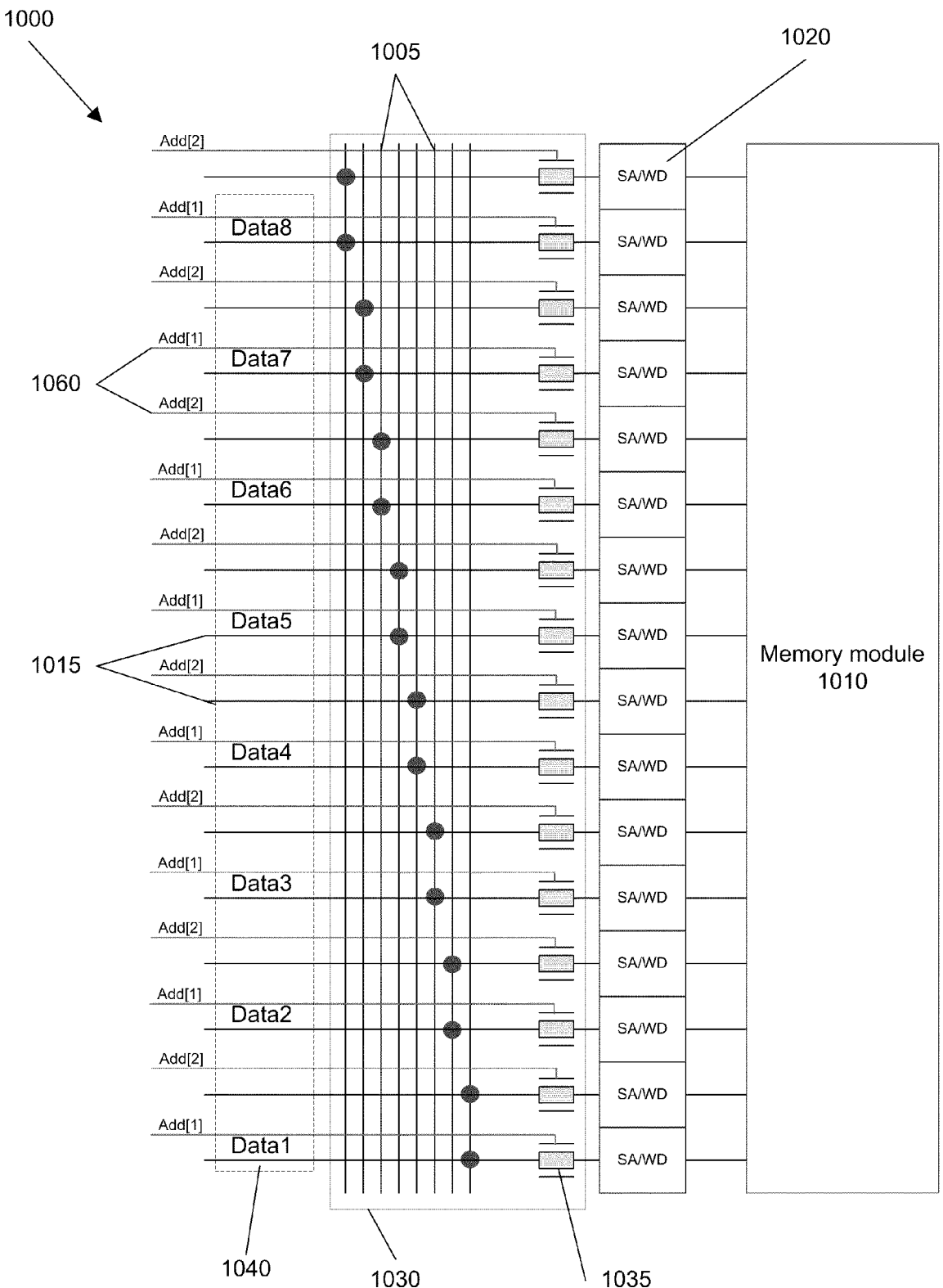
FIG. 10 shows an I/O device including a muxing structure configured to have a bus width of X8 according to an embodiment of the present invention.

FIG. 10 shows an example of an I/O device 1000 configured for an X8 (eight-bit) data bus width according to an embodiment of the invention. The construction of I/O device 1000 is similar to that of I/O device 900. Muxing structure 1030 is shown in a dotted line. There are sixteen SA/WDs 1020 connected to the memory module 1010. There are sixteen switches 1035, each of which is connected to one SA/WD. The address lines 1060 control which of the switches 1035 are opened to transmit or receive a data bit.

The I/O lines 1015 from the SA/WDs labeled 15-16 are each electrically connected together through one of the vertical connector lines 1005. Thus, SA/WDs labeled 15-16 are coupled to the DATA8 port of the I/O element 1040. The I/O lines 1015 from the SA/WDs labeled 13-14 are each electrically connected together through another of the vertical connector lines 1005. Thus, SA/WDs labeled 13-14 are coupled to the DATA7. Similarly, the SA/WDs labeled 11-12 are coupled to the DATA6 port; SA/WDs labeled 9-10 are coupled to the DATA5 port; SA/WDs labeled 7-8 are coupled to the DATA4 port; SA/WDs labeled 5-6 are coupled to the DATA3 port; SA/WDs labeled 3-4 are coupled to the DATA2 port; and SA/WDs labeled 1-2 are coupled to the DATA1 port.

Figure 11:
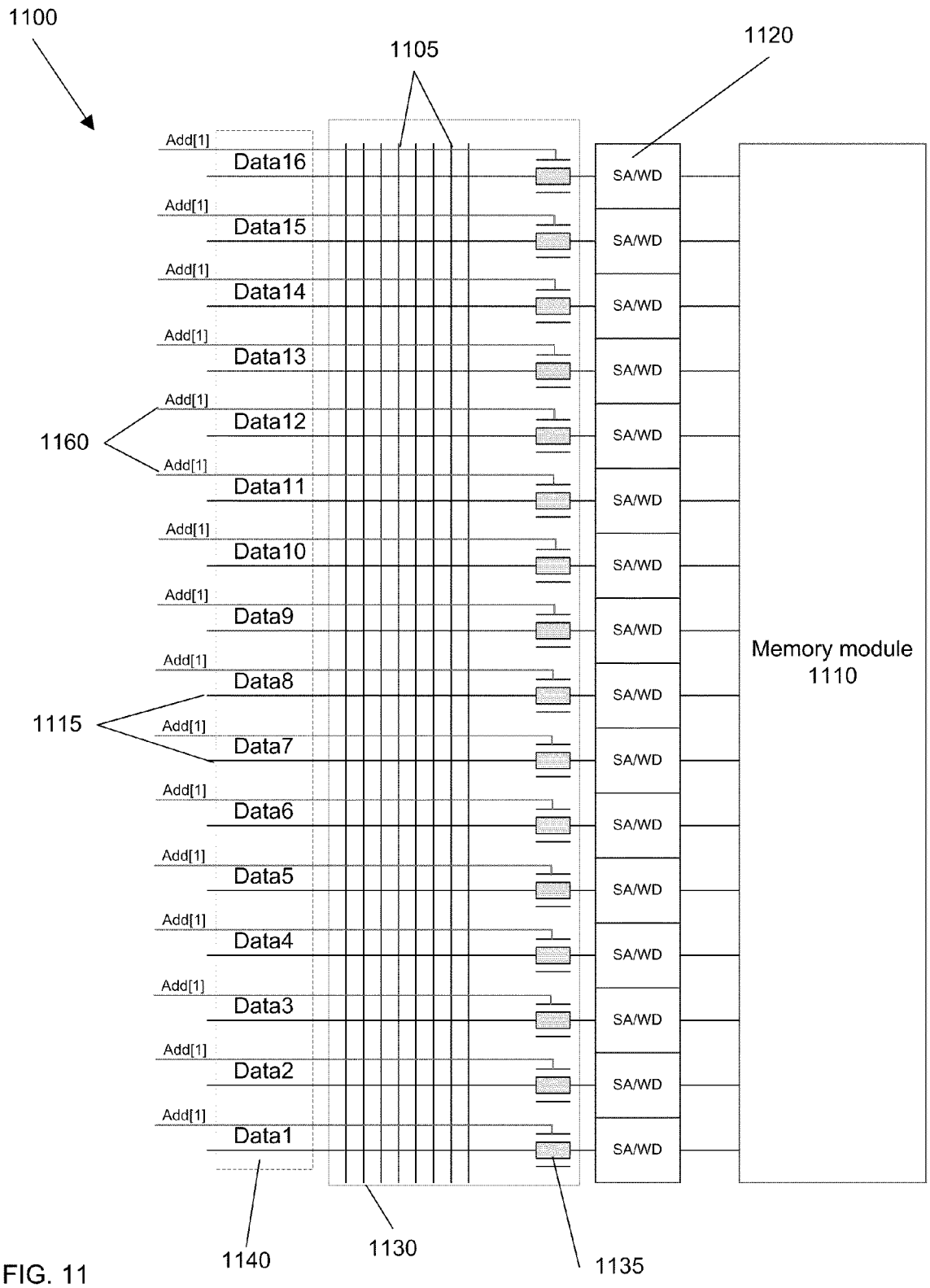
FIG. 11 shows an I/O device including a muxing structure configured to have a bus width of X16 according to an embodiment of the present invention.

FIG. 11 shows an example of an I/O device 1100 configured for an X16 (sixteen-bit) data bus width according to an embodiment of the invention. Muxing structure 1130 is shown with a dotted line. There are sixteen SA/WDs 1120 connected to the memory module 1110. There are sixteen switches 1135, each of which is connected to one SA/WD. The address lines 1160 control which of the switches 1135 are opened to transmit or receive a data bit.

In this embodiment, none of the I/O lines 1115 are electrically connected to any of the vertical connector lines 1105. Each SA/WD is coupled to one DATA port of the I/O element 1140. In FIG. 11, SA/WD labeled 16 is couple to DATA16 port of the I/O element 1140, and every other SA/WD is similarly coupled to a respective DATA port. The exact arrangement of coupling may be ordered as shown in FIG. 11, in reverse ordering, or of any arrangement ordered or random.

In summary, the connector lines electrically connect groups of switches, and the corresponding SA/WD of each switch, so that each group contributes one bit to the overall bus width. Thus, each group sends one bit to an I/O circuit element within an integrated circuit. The switches control which bit within each group is sent. Accordingly, FIGS. 7-11 show embodiments of an I/O device with a grid-like muxing structure that may be configured to have any data bus width. Although FIGS. 7-11 show embodiments with an even number of groups of switches connected together, other embodiments may have an odd number of groups of switches connected together. Such an arrangement can give any size bus width up to a set maximum. The control or address signals can still ensure access of the proper data in such an odd arrangement. Also, the lines in FIGS. 7-11 can be metal, polysilicon, or a diffused or implanted region in silicon, such as a source/drain region. These lines (interconnects) can be connected using vias or contacts, as appropriate.

Figure 12:
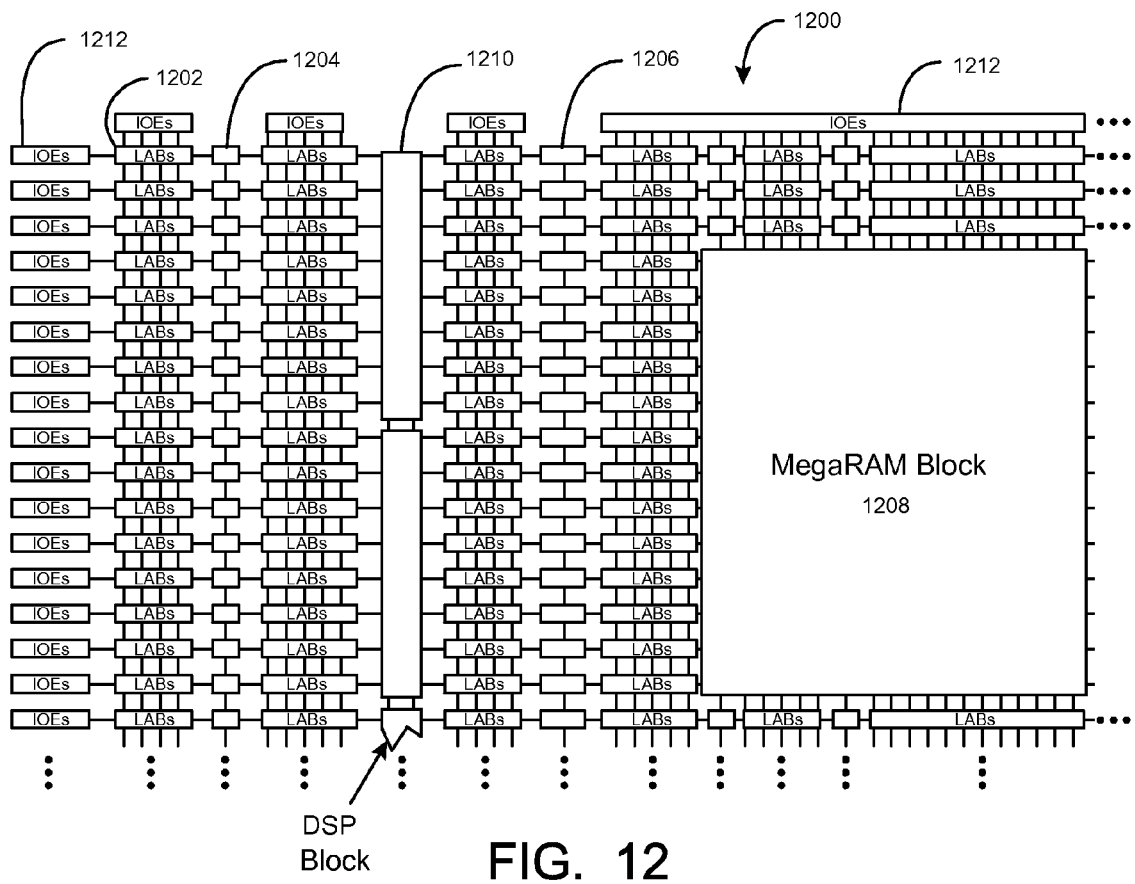
FIG. 12 is a simplified block diagram of an integrated circuit device that does benefit by incorporating embodiments of the present invention.

FIG. 12 is a simplified partial block diagram of an exemplary high-density structured ASIC or programmable logic device 1200 wherein techniques according to the present invention can be utilized. PLD 1200 includes a two-dimensional array of programmable logic array blocks (or LABs) 1202 that are interconnected by a network of column and row interconnections of varying length and speed. When the PLD or FPGA is migrated to an ASIC, the LABs 1202 may be replaced by function specific logic elements. LABs 1202 include multiple (e.g., 10) logic elements (or LEs), an LE being a small unit of logic that provides for efficient implementation of user defined logic functions.

PLD 1200 also includes a distributed memory structure including RAM blocks of varying sizes provided throughout the array. The RAM blocks include, for example, 512 bit blocks 1204, 4K blocks 1206 and an M-Block 1208 providing 512K bits of RAM. These memory blocks may also include shift registers and FIFO buffers. PLD 1200 further includes digital signal processing (DSP) blocks 1210 that can implement, for example, multipliers with add or subtract features.

It is to be understood that PLD 1200 is described herein for illustrative purposes only and that the present invention can be implemented in many different types of PLDs, FPGAs, structured ASICs and the other types of digital integrated circuits.

Figure 13:
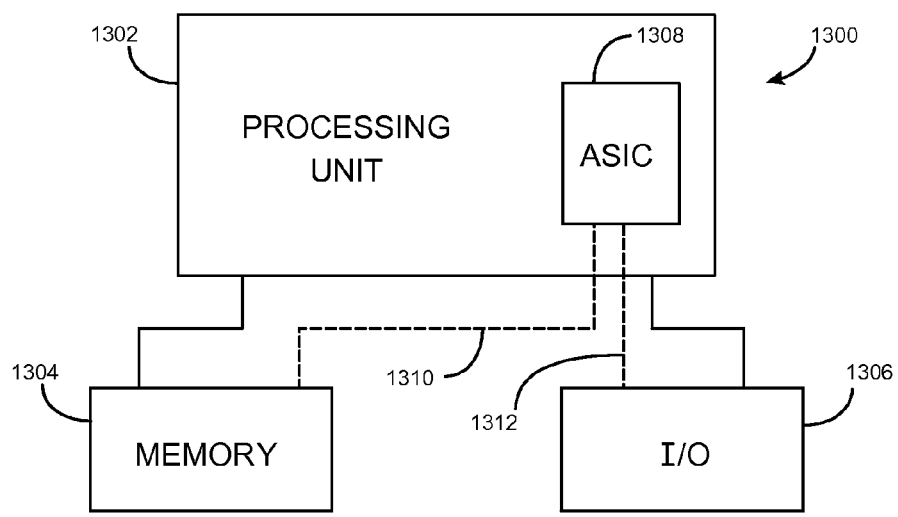
FIG. 13 is a block diagram of an electronic system that does benefit by incorporating embodiments of the present invention.

While PLDs of the type shown in FIG. 12 provide many of the resources required to implement system level solutions, the present invention can also benefit systems wherein a PLD is one of several components. FIG. 13 shows a block diagram of an exemplary digital system 1300, within which the present invention may be embodied. System 1300 can be a programmed digital computer system, digital signal processing system, specialized digital switching network, or other processing system. Moreover, such systems may be designed for a wide variety of applications such as telecommunications systems, automotive systems, control systems, consumer electronics, personal computers, electronic displays, Internet communications and networking, and others. Further, system 1300 may be provided on a single board, on multiple boards, or within multiple enclosures.

System 1300 includes a processing unit 1302, a memory unit 1304 and an I/O unit 1306 interconnected together by one or more buses. According to this exemplary embodiment, a programmable logic device (PLD) 1308 is embedded in processing unit 1302. PLD 1308 may serve many different purposes within the system in FIG. 13. PLD 1308 can, for example, be a logical building block of processing unit 1302, supporting its internal and external operations. PLD 1308 is programmed to implement the logical functions necessary to carry on its particular role in system operation. PLD 1308 may be specially coupled to memory 1304 through connection 1310 and to I/O unit 1306 through connection 1312.

Processing unit 1302 may direct data to an appropriate system component for processing or storage, execute a program stored in memory 1304 or receive and transmit data via I/O unit 1306, or other similar function. Processing unit 1302 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 1308 can control the logical operations of the system. In an embodiment, PLD 1308 acts as a reconfigurable processor, which can be reprogrammed as needed to handle a particular computing task. Alternately, programmable logic device 1308 may itself include an embedded microprocessor. Memory unit 1304 may be a random access memory (RAM), read only memory (ROM), fixed or flexible disk media, PC Card flash disk memory, tape, or any other storage means, or any combination of these storage means.

Embodiments of the present invention may be used to improve circuits that interface with the memory unit 1304. While embodiments of the present invention particularly benefit these interface circuits when digital integrated circuit 1308 is an ASIC, embodiments may benefit other integrated circuits using multiple data bus widths.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of manufacturing a memory interface having a configurable bus width, comprising:
   providing a first set of lines;
   providing a second set of lines;
   providing a plurality of locations, wherein a via may be placed at each location; and
   placing a plurality of vias at a portion of the plurality of locations, wherein each via directly connects a line of the first set to a line of the second set;
   wherein the bus width is determined by the placement of the plurality of vias.

2. The method of claim 1, further comprising:
   coupling each of a plurality of switches at a first end of each switch with a line of the first set.

3. The method of claim 2, wherein the plurality of switches are pass gates.

4. The method of claim 2, further comprising:
   coupling a plurality of control signals with the plurality of switches, wherein the control signals control the states of the switches.

5. The method of claim 4, wherein the plurality of control signals are coupled with an address register.

6. The method of claim 1, further comprising
   coupling a circuit element with one or more lines of the first set.

7. The method of claim 6, wherein the circuit element is a data register.

8. The method of claim 1, further comprising:
   coupling a plurality of lines of the first set with each other to form a group by placing a via between each of the plurality of lines of the first set and the same line of the second set.

9. The method of claim 8, wherein each line of the second set couples together a group of lines of the first set, wherein the number of lines in each group is $2^N$, where N is an integer.

10. The method of claim 1, further comprising:
    coupling each of a plurality of sensing devices at a first end of the sensing device with one of the plurality of switches.

* * * * *